United States Patent
Vassalli et al.

(10) Patent No.: US 6,638,833 B1
(45) Date of Patent: Oct. 28, 2003

(54) PROCESS FOR THE FABRICATION OF INTEGRATED DEVICES WITH REDUCTION OF DAMAGE FROM PLASMA

(75) Inventors: Omar Vassalli, Pradalunga (IT); Simone Alba, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/804,693

(22) Filed: Mar. 9, 2001

(51) Int. Cl.[7] ............................................. H01L 21/76
(52) U.S. Cl. ....................... 438/454; 438/738; 438/942
(58) Field of Search ................... 438/454, 942, 438/738

(56) References Cited

U.S. PATENT DOCUMENTS

| | | | | |
|---|---|---|---|---|
| 5,387,556 A | * | 2/1995 | Xiaobing et al. | 216/67 |
| 5,795,829 A | * | 8/1998 | Shen | 427/535 |
| 5,843,848 A | * | 12/1998 | Yanagawa | 216/77 |
| 5,962,341 A | * | 10/1999 | Ito | 257/752 |
| 5,976,986 A | * | 11/1999 | Naeem et al. | 204/192.35 |
| 6,090,722 A | * | 7/2000 | Armacost et al. | 438/249 |
| 6,197,689 B1 | * | 3/2001 | Tabara | 438/669 |
| 6,420,099 B1 | * | 7/2002 | Gutsche et al. | 216/100 |
| 6,451,705 B1 | * | 9/2002 | Trapp et al. | 216/41 |

FOREIGN PATENT DOCUMENTS

| | | |
|---|---|---|
| EP | 0710977 A1 | 5/1996 |
| EP | 0874395 A2 | 10/1998 |

OTHER PUBLICATIONS

Hummel Rolf E. Electronic Properties of Materials 3rd ed., Springer Verlag 2001, pp. 166–174.*

Hwang et al., "On the link between electron shadowing and charging damage," *J. Vac. Sci. Technol. B* 15(5):1839–1842, Sep./Oct. 1997.

Siu et al., "Effect of plasma density and uniformity, electron temperature, process gas, and chamber on electron shading damage," Lam Research Corporation, Fremont. CA.

Hashimoto et al., "Reduction of the charging damage from electron shading," *1996 1st International Symposium on Plasma Process–Induced Damage* May 13–14, Santa Clara, CA., 1996 American Vacuum Society.

Hashimoto, Koichi, "Charge damage caused by electron shading effect," *Jpn. J. Appl. Phys.* vol. 33, Part 1(10):6013–6018, Oct. 1994.

* cited by examiner

*Primary Examiner*—Vu A. Le
*Assistant Examiner*—Michael K. Luhrs
(74) *Attorney, Agent, or Firm*—Lisa K. Jorgenson; David V. Carlson; SEED IP Law Group PLLC

(57) ABSTRACT

The process for the fabrication of an electronic device has the steps of forming a layer to be etched on top of a substrate in a wafer of semiconductor material; depositing a masking layer; and carrying out a plasma etch to define the geometry of the layer to be etched. The masking layer is made so as to be conductive, at least during one part of the etching step; in this way, the electrons implanted on the top part of the masking layer during plasma etching can recombine with the positive charges which have reached the layer to be etched. The recombination of the charges makes it possible to prevent damage from plasma resulting from the formation of parasitic electric currents which are detrimental to the electronic device itself.

40 Claims, 3 Drawing Sheets

PROCESS FOR THE FABRICATION OF INTEGRATED DEVICES WITH REDUCTION OF DAMAGE FROM PLASMA

TECHNICAL FIELD

The present invention relates to a process for the fabrication of integrated devices with reduction of damage from plasma.

BACKGROUND OF THE INVENTION

For the fabrication of the integrated devices which are on the market at present, the monocrystalline silicon wafers are subjected to a plurality of physical and chemical treatments which make it possible to define the topographies of the integrated electronic circuits.

In particular, for definition of electronic components in submicrometric technologies, extensive use is made of a process technique which is known as plasma etching, which makes it possible to etch thin films, both of conductive materials and dielectric materials.

A known example of application of the plasma etching technique is illustrated in FIGS. 1–3, in which a portion of a wafer 1 comprises a substrate 2 of semiconductor material and a layer of sensitive material 3 on top of the substrate 2; the layer of sensitive material 3 can for example be a layer of dielectric material, a layer of polycrystalline silicon, or a layer of metallization, which must be defined by means of plasma etching.

As illustrated in FIG. 2, on top of the layer of sensitive material 3, a mask 4 is produced in order to protect the portions which are not to be removed, of the layer of sensitive material 3 itself.

In particular, the mask 4 is produced from a known material such as photoresist or resist material, which consists of photosensitive organic polymers.

As illustrated in FIG. 3, after the plasma etching has been carried out, a defined layer 3 of sensitive material is obtained.

During the plasma etching, an equal quantity of positive ions and electrons is directed towards the wafer 1, but in individual areas of the wafer there are two mechanisms which lead to separation of the electric charges on the wafer 1, i. e.:

lack of uniformity of the plasma itself, as a result of which more negative than positive charges reach certain areas on the wafer, whereas in other areas the contrary applies; and
  the electron shading effect.

The electron shading effect is the effect according to which a part of the negative charges is implanted in the mask, instead of reaching the layer to be etched, whereas most of the positive charges reach it successfully. This gives rise to separation of electric charges, and thus to generation of an electric field, which can cause damage to the layer of sensitive material 3.

It is considered that the electron shading effect is caused by the lower weight, and therefore by the greater thermal agitation of the electrons themselves. Thus, whereas the positive ions have a prevalently vertical speed vector, and reach directly the surface of the layer to be etched, the electrons also have a significant horizontal component, which means that some of the electrons collide with the upper portion of the mask 4, and do not reach the layer of sensitive material 3 to be etched.

A detailed description of the electron shading effect is described for example in the articles: "Reduction of the charging damage from electron shading," by K. Hashimoto, Y. Hikosaka, A. Hasegawa and M. Nakamura, in 1996 1st International Symposium on Plasma Process-induced Damage, May 13–14, Santa Clara, Calif. 1996 American Vacuum Society; "On the link between electron shadowing and charging damage," by Gyeong S. Hwang and Konstantinos P. Giapis, in J. Vac. Sci. Technol. B 15(5), Sep./Oct. 1997; "Charge damage caused by electron shading effect," by K. Hashimoto, in Jpn. J. Appl. Phys. Vol. 33 (1994), Part 1, No. 10, Oct. 1994, p 6013.

The electron shading effect is disadvantageous owing to the fact that the positive charges on the layer of sensitive material 3 to be etched recall electrons from the substrate 2 beneath, thus giving rise to a passage of current in the structures of the devices.

The electric currents which pass through the thin oxides of electronic devices can damage the latter, modifying their properties and giving rise to problems of functioning of the devices themselves, or reducing their reliability over a period of time.

SUMMARY OF THE INVENTION

The object of the present invention is to provide a process which can reduce to a minimum, or even eliminate the damage from plasma caused by the electron shading effect.

According to the present invention, a layer to be etched is formed on the surface of a semiconductor substrate. A non-conductive mask is formed on the surface of the layer on which the plasma etch procedure is to be performed. At some time, a conductive outer layer is provided for the mask. In one embodiment, the conductive outer layer is provided before the etching begins. In an alternative embodiment, the etching is performed for a period of time, interrupted, the conductive outer layer provided, after which the etching is resumed.

The semiconductor substrate is protected from damaged caused by parasitic electrical currents by virtue of the fact that the electrons that fail to reach the layer can propagate through the conductive mask and recombine with the positive charges that strike the layer. As a result, parasitic currents are reduced or eliminated in the substrate.

BRIEF DESCRIPTION OF THE DRAWINGS

In order to assist understanding of the present invention, four preferred embodiments are now described, purely by way of non-limiting example, and with reference to the attached drawings, in which.

DETAILED DESCRIPTION OF THE INVENTION

Figure 1:
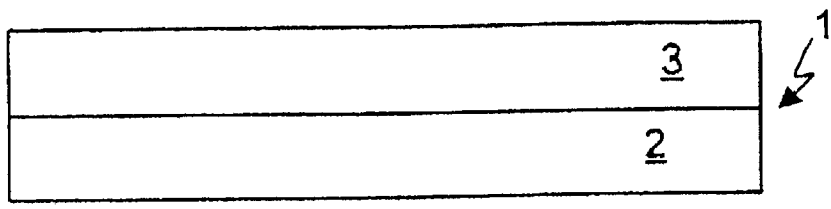
FIG. 1 shows a transverse cross-section through a silicon wafer, in a first step of a process according to the known art.
Figure 2:
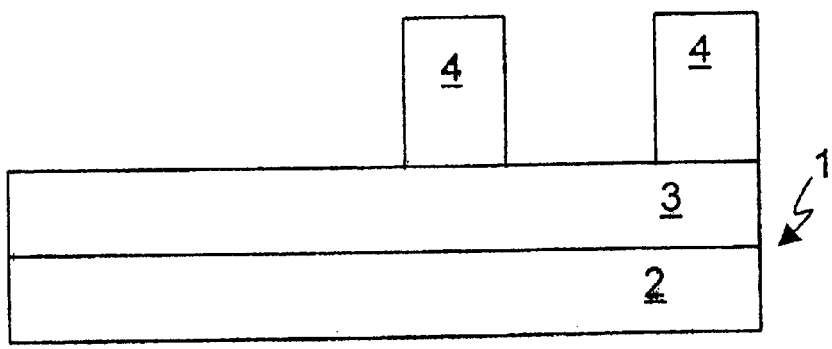
FIG. 2 shows a transverse cross-section similar to that in FIG. 1, in a subsequent fabrication step.
Figure 3:
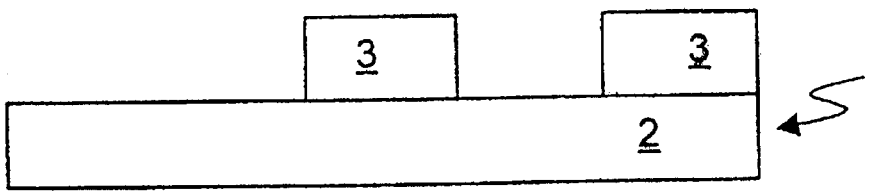
FIG. 3 shows a transverse cross-section similar to that in FIG. 1, in a subsequent fabrication step.
Figure 4:
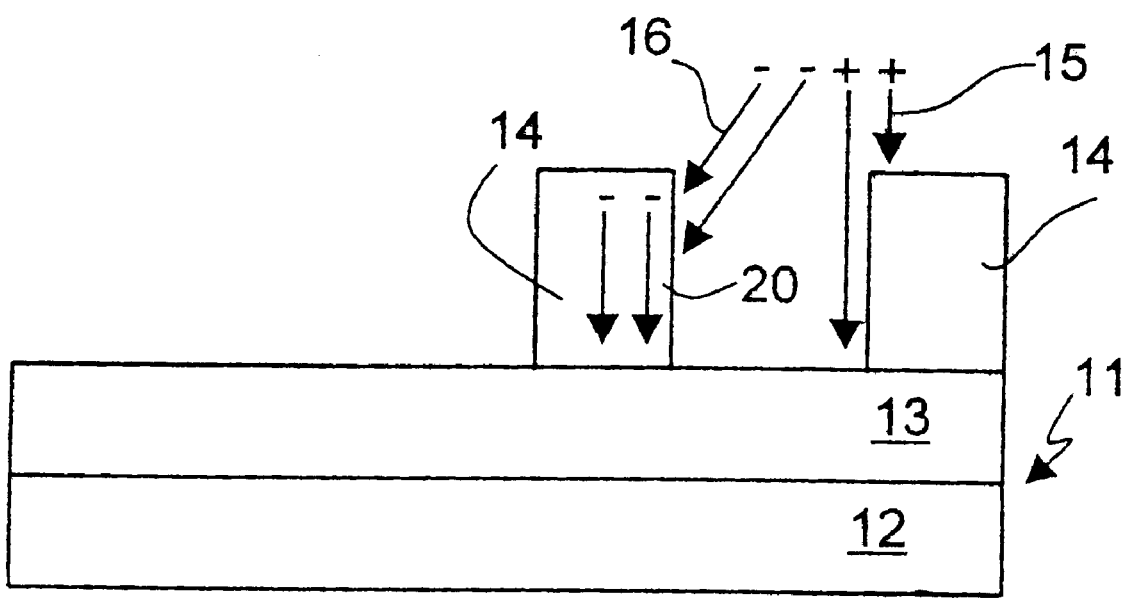
FIG. 4 shows a transverse cross-section through a silicon wafer in a step of a first and a second embodiment of a method according to the present invention.

FIG. 4 illustrates schematically a wafer 11, formed by a substrate 12 of monocrystalline silicon, superimposed by a layer to be etched 13.

The layer to be etched 13 may be one of a number of materials, including silicon dioxide, silicon nitride, BPSG, EPI, or other layers to be etched during the manufacture of a semiconductor chip.

A mask 14 is formed on top of the layer to be etched 13, and the device is then subjected to plasma etching, for definition of the geometry of the layer to be etched 13.

During this etching, the wafer 11 is placed in an isolated chamber, and is irradiated with an equal quantity of electrons and positive ions.

The mask 14 is produced such as to be conductive, and it allows the electrons which have become stationary on the upper portion of the mask 14 to move, and recombine with the positive charges which have already reached the layer to be etched 13. This prevents the formation of parasitic electric currents, which are damaging to the electronic device, and thus prevents damage from plasma.

The effect of the mask 14 is shown in FIG. 4, in which arrows 15 indicate the direction of the positive charges during the plasma etching, arrows 16 indicate the direction of the negative charges, and arrows 20 indicate the displacement undergone by the negative charges, from the upper portion of the mask 14, towards the layer to be etched 13.

According to a first embodiment of the invention, the mask 14 is made from photosensitive organic polymers. Thus, before the plasma etching is carried out, the mask 14 is subjected to intensive ionic bombardment, which for example can take place using Ar, N2, As, inside an implanting device. By this means, the mask 14 is graphitized, i.e., it is partially transformed into graphite.

The bombardment of atoms gives rise to breakage of the carbon-hydrogen (C—H) bonds of the organic polymers, thus assisting the formation of single and double carbon-carbon bonds (C—C and C=C). By this means, the photosensitive organic polymers assume a structure which is partially similar to that of the graphite, in which the electrons are free to move, and therefore acquire electrical conductivity.

The graphitization can be carried out such as to convert all or only part of the mask 14. In fact, it is sufficient for the outer layer to be graphitized. The graphitization implant is therefore carried out with a certain angle of incidence, so as to reach also the vertical walls of the mask 14, and in particular their lower portion. For example, the bombardment is preferably carried out at a current of 6 A, with a dose of $2 \times 10^5$ atoms/cm$^3$, wherein the atoms have energy of between 50–100 eV.

According to a second embodiment, the mask 14 is made from photosensitive organic polymers. These photosensitive organic polymers comprise chains of double, conjugated carbon-carbon bonds (—C=C—C=C—), i.e., chains in which a double carbon-carbon bond is alternated with a single carbon-carbon bond, or chains with triple carbon-carbon bonds, which alternate with double bonds or single bonds.

Before the plasma etching is carried out, the mask 14 is subjected to implanting with doping ion species, which makes it conductive. The implanting can be carried out in an implanting device, or by means of implanting with plasma, or by simple contact of photosensitive organic polymers with vapor of doping species, or with doping species dissolved in an organic solvent.

The doping species which can be used to carry out the implanting are for example selected from amongst the group which consists of $I_2$, ICl, IBr, HBr, AsF$_5$, WF$_6$, TiCl$_4$, TiI$_4$.

Figure 5:
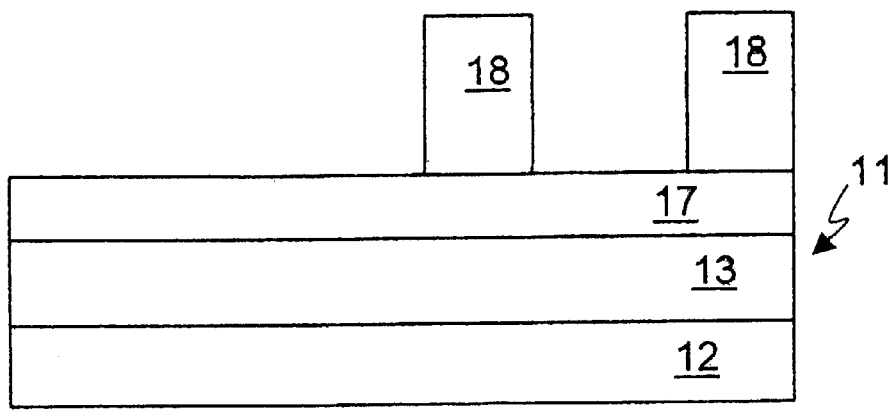
FIG. 5 shows a transverse cross-section through a silicon wafer in a step of a third embodiment of a method according to the present invention.
Figure 6:
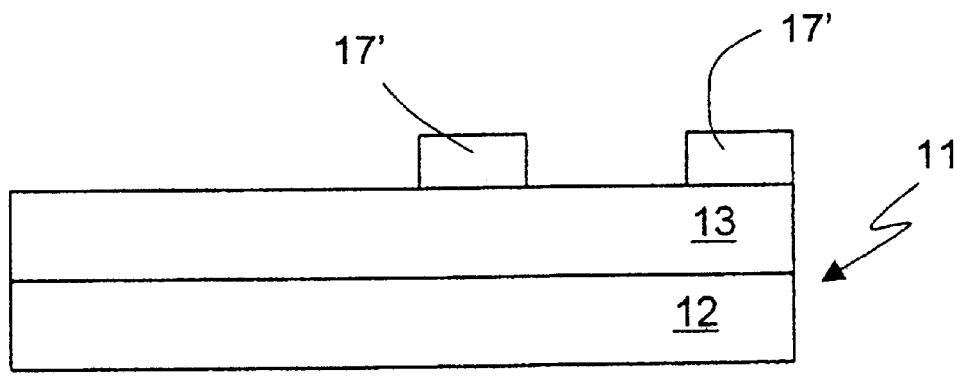
FIG. 6 shows a transverse cross-section similar to that in FIG. 5, in a subsequent fabrication step.

According to a third embodiment, which is illustrated in detail in FIGS. 5 and 6, the process for production of electronic devices comprises the step of depositing a conductive layer 17 on the layer to be etched 13. Subsequently (FIG. 5), an auxiliary, photoresist mask 18 is produced on top of the conductive layer 17, and a step of etching and definition is then carried out, during which the conductive layer 17 is defined according to the geometry of the auxiliary mask 18, and forms a mask 17' which is similar to the mask 14 in FIG. 4.

After the auxiliary mask 18 has been removed (FIG. 6), the plasma etching step is carried out, which defines the layer to be etched 13 according to the geometry of the mask 17'.

The conductive layer 17 is preferably made of tungsten.

Figure 7:
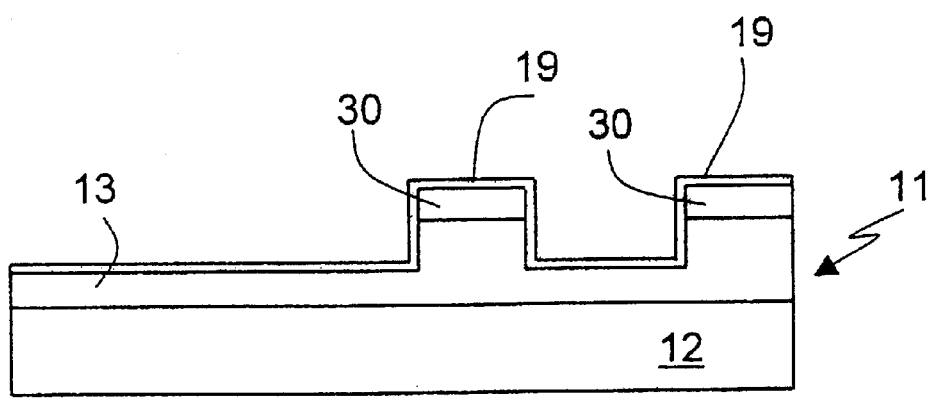
FIG. 7 shows a transverse cross-section through a silicon wafer in a step of a fourth embodiment of a method according to the present invention.

According to a fourth embodiment, and as illustrated in FIG. 7, a masking structure 30 made of non-conductive material (for example resist material) is initially produced. Then, before the plasma etching step, a conductive layer 19 is deposited, which for example is formed from a conductive polymer. The conductive layer 19 is deposited in the same isolated chamber in which the plasma etching is carried out, and at a pressure which is lower than atmospheric pressure, for example 10–1000 mTorr, and with a flow of 10–400 sccm (standard cube centimeters per minute).

The conductive layer 19 is for example a polymer which is obtained from the reaction with plasma, of boron trichloride (BCl$_3$) with nitrogen (N$_2$). Alternatively, it is possible to use a polymer obtained from the polymerization of gas of aromatic organic molecules, for example benzene and its monocyclical and polycyclical derivatives, or heterocyclical aromatic compounds.

It is also possible to deposit the conductive layer 19 in a chamber different from that in which the plasma etching takes place.

Preferably, the chamber in which the conductive layer 19 is deposited is provided with a device for feeding and/or distribution of gas.

In particular, the thickness of the conductive layer 19 must be minimal (for example 3–10 nm), in order not to interfere with the subsequent plasma etching.

Since the electron shading effect begins to take effect when the layer to be etched 13 has been almost completely removed, the conductive layer 19 is deposited shortly before the etching of the layer to be etched 13 is completed, for example when, in the areas which are exposed and are not covered by the mask 30, the layer to be etched 13 has reached a thickness of 50–100 nm.

The advantages of the process described for fabrication of electronic devices are apparent from the foregoing description. In particular, the fact is emphasized that it makes it possible to reduce, or even eliminate, damage from plasma, owing to the fact that it permits recombination of the electric charges which are separated during the etching.

In addition, it is particularly advantageous in the case when the layer to be etched is the metallization layer used to define the electrical connections between the components of the integrated circuit. However, it can also advantageously be used in the case of isolating layers or regions of semiconductor material, whether these are produced on top of the substrate, or belong to the substrate itself.

Finally, it is apparent that many modifications and variants can be made to the process for fabrication described and illustrated here, all of which come within the scope of the inventive concept, as defined in the attached claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A Process for the fabrication of an electronic device, comprising the steps of:
    forming a body of semiconductor material which includes a region to be etched;
    producing a masking structure which has a geometry;
    carrying out a plasma etch to define the region to be etched according to the geometry of said masking structure; and
    producing a conductive path prior to carrying out said plasma etching step for electric charges which are present on said masking structure during said plasma etching step.

2. Process according to claim 1 wherein said step of producing a conductive path includes the step of: rendering said masking structure conductive.

3. Process according to claim 2 wherein said step of rendering the masking structure conductive comprises the steps of:
    depositing a layer of conductive material; and
    etching said layer of conductive material to obtain said layer of conductive material according to the geometry of said mask.

4. Process according to claim 3 wherein said layer of conductive material is made of tungsten.

5. Process according to claim 1 wherein said masking structure is made of non-conductive material, and further comprising the step of treating said masking structure to render it conductive.

6. Process according to claim 5 wherein said masking structure is comprised of photosensitive organic polymers, and in that said step of treating said masking structure comprises the steps of graphitizing said masking structure at least partially, and introducing conductive species.

7. Process according to claim 6 wherein said step of introducing conductive species is carried out by means of bombardment with ions of Ar, $N_2$, As.

8. Process according to claim 7 wherein said bombardment is carried out at a current of 5–7 A, with a dose of $1-3\times10^5$ atoms/cm3, said atoms having energy of between 50 and 100 eV.

9. Process according to claim 2 wherein the step of rendering said masking structure conductive comprises the steps of:
    depositing a layer of photosensitive organic polymers, comprising chains of carbon with double or triple conjugated bonds; and
    doping said organic polymers to render them conductive.

10. Process according to claim 9 wherein said doping step is carried out with at least one from amongst the group comprising: $I_2$, ICl, IBr, HBr, $AsF_5$, $WF_6$, $TiCl_4$, $TiI_4$.

11. Process according to claim 10 wherein said doping step takes place by direct contact of said photosensitive organic polymers in a vapor phase.

12. Process according to claim 10 wherein said doping step takes place by direct contact of said organic polymers in organic solvent.

13. Process according to claim 10 wherein said doping step takes place by means of implanting with plasma.

14. Process according to claim 1 wherein said step of producing a conductive path comprises the step of:
    depositing a layer of conductive material on top of said masking structure.

15. Process according to claim 14 wherein said etching step comprises a first etching sub-step and a second etching sub-step, and in that said step of depositing a layer of conductive material is carried out between said first and said second etching sub-steps.

16. Process according to claim 14 wherein said layer of conductive material is polymeric.

17. Process according to claim 14 wherein said step of depositing a layer of conductive material takes place by depositing with plasma.

18. Process according to claim 14 wherein said steps of depositing a layer of conductive material and carrying out plasma etching take place in a single chamber.

19. Process according to claim 14 wherein said step of depositing a layer of conductive material is carried out at a pressure of 10–1000 mTorr, and with a flow of 10–400 sccm.

20. Process according to claim 14 wherein said steps of depositing a layer of conductive material and carrying out plasma etching take place in different chambers.

21. Process according to claim 14 wherein said conductive material is obtained from the reaction with plasma of $BCl_3$ and $N_2$.

22. Process according to claim 14 wherein said conductive material is polymer obtained from polymerization of gas of aromatic molecules.

23. A method comprising:
    forming a layer of semiconductor material, which includes a region to be etched;
    overlaying on top of the body of the semiconductor material a masking structure;
    carrying out a plasma etch of a portion of the semiconductor material which is overlayed by the masking structure;
    rendering the masking structure as conductive; and
    continuing to carry out a plasma etch of the body semiconductor material to obtain a region corresponding to the region to be etched.

24. The method according to claim 23 wherein said non-conductive masking structure comprises photosensitive organic polymers, and wherein rendering the masking structure conductive comprises:
    graphitizing said masking structure, at least partially.

25. The method according to claim 23 wherein said non-conductive masking structure comprises photosensitive organic polymers, and wherein rendering the masking structure conductive comprises:
    implanting the masking structure with a dopant.

26. The method according to claim 23 wherein the step of carrying out the plasma etch is begun prior to rendering the masking structure conductive.

27. The method according to claim 26 wherein the step of carrying out the plasma etch is interrupted, the step of rendering the masking structure conductive is performed, and the step of carrying out the plasma etch is completed.

28. The method according to claim 27 wherein rendering the masking structure conductive comprises:
    depositing a conductive layer onto said masking structure.

29. A process for the fabrication of an electronic device comprising the steps of:
    forming a body of semiconductor material which includes a region to be etched;

forming a masking structure overlying said body semiconductor material, the masking structure having a geometry and being comprised of non-conductive material;

producing a masking structure composed of photosensitive organic polymers;

producing a conductive path for electric charges which are present on the masking structure during a plasma etching, said conductive path being created by treating the masking structure so as to render it conductive by graphitizing the masking structure and introducing a conductive species into the masking structure; and carrying out a plasma etch to define the region to be etched, according to the geometry of said masking structure.

30. The process according to claim 29 wherein said etching step comprises a first etching sub-step and a second etching sub-step, and in that said step of depositing a layer of conductive material is carried out between said first and said second etching sub-steps.

31. The process according to claim 29 wherein said layer of conductive material is polymeric.

32. The process according to claim 29 wherein said step of depositing a layer of conductive material takes place by depositing with plasma.

33. The process according to claim 29 wherein said step of depositing a layer of conductive material takes place by chemical depositing.

34. The process according to claim 29 wherein said steps of depositing a layer of conductive material and carrying out plasma etching take place in a single chamber.

35. The process according to claim 29 wherein said step of depositing a layer of conductive material is carried out at a pressure of 10–1000 mTorr, and with a flow of 10–400 sccm.

36. The process according to claim 29 wherein said steps of depositing a layer of conductive material and carrying out plasma etching take place in different chambers.

37. Process according to claim 29 wherein said conductive material is obtained from the reaction with plasma of BCl3 and N2.

38. Process according to claim 29 wherein said conductive material is polymer obtained from polymerization of gas of aromatic molecules.

39. A process for the fabrication of an electronic device, comprising the steps of:

forming a body of semiconductor material which includes a region to be etched;

forming a masking structure overlying said body of semiconductor material, the masking structure having a geometry corresponding to the geometry to be etched;

depositing a layer of conductive material on top of said masking structure so as to provide a conductive path for electric charges which may be present on the masking structure during a plasma etching step; and carrying out a plasma etch to define the region to be etched according to the geometry of said masking structure.

40. A method comprising:

forming a layer of semiconductor material, which includes a region to be etched;

overlying on top of the layer of semiconductor material a non-conductive masking structure composed of a photosensitive organic polymer;

rendering the masking structure conductive by implanting the masking structure with a dopant;

carrying out a plasma etch of the body of semiconductor material using the masking structure as a mask to define the regions to be etched.

* * * * *